(12) United States Patent
Holscher et al.

(10) Patent No.: US 6,417,076 B1
(45) Date of Patent: Jul. 9, 2002

(54) AUTOMATED COMBI DEPOSITION APPARATUS AND METHOD

(75) Inventors: Richard D. Holscher; Ziad R. Hatab; David Q. Wright, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 57 days.

(21) Appl. No.: 09/586,952

(22) Filed: Jun. 5, 2000

(51) Int. Cl.[7] .................. H01L 21/301; H01L 21/46; H01L 21/78; H01L 21/00; H01L 21/64
(52) U.S. Cl. ........................... 438/462; 29/25.01
(58) Field of Search ........................ 438/462; 29/25.01

(56) References Cited

U.S. PATENT DOCUMENTS

| | | | |
|---|---|---|---|
| 4,779,004 A | 10/1988 | Tew et al. | |
| 5,710,407 A | 1/1998 | Moore et al. | |
| 5,733,711 A | 3/1998 | Juengling | |
| 5,852,497 A | 12/1998 | Pramanik et al. | |
| 5,982,044 A | * 11/1999 | Lin et al. | |
| 6,239,031 B1 | * 5/2001 | Kepler et al. | |

OTHER PUBLICATIONS

Jeffrey P. Hebb and Klavs F. Jensen, *The Effect of Patterns on Thermal Sress During Rapid Thermal Processing of Silicon Wafer*, IEEE Transaction on Semiconductor Manufacturing, vol. II, No. 1, Feb. 1998.

* cited by examiner

Primary Examiner—David E. Graybill
(74) Attorney, Agent, or Firm—Dickstein Shapiro Morin & Oshinsky LLP

(57) ABSTRACT

A method and system for protecting global alignment marks during the fabrication of wafers are described. A semiconductor wafer-in-process includes a substrate having one or more global alignment sites, each site having an alignment mark. A photoresist material is deposited over the wafer-in-process, including over the alignment marks. A stepper or other suitable device exposes full field images over the entire wafer-in-process, thus exposing a portion of the photoresist material covering the alignment marks which is developed. A globule of protective material is deposited over the patterned photoresist over the alignment marks, thus protecting them during a subsequent etching step. The globule of protective material can also be deposited over a portion of any other adjacent structures which need protection during etching.

11 Claims, 9 Drawing Sheets

FIG. 1
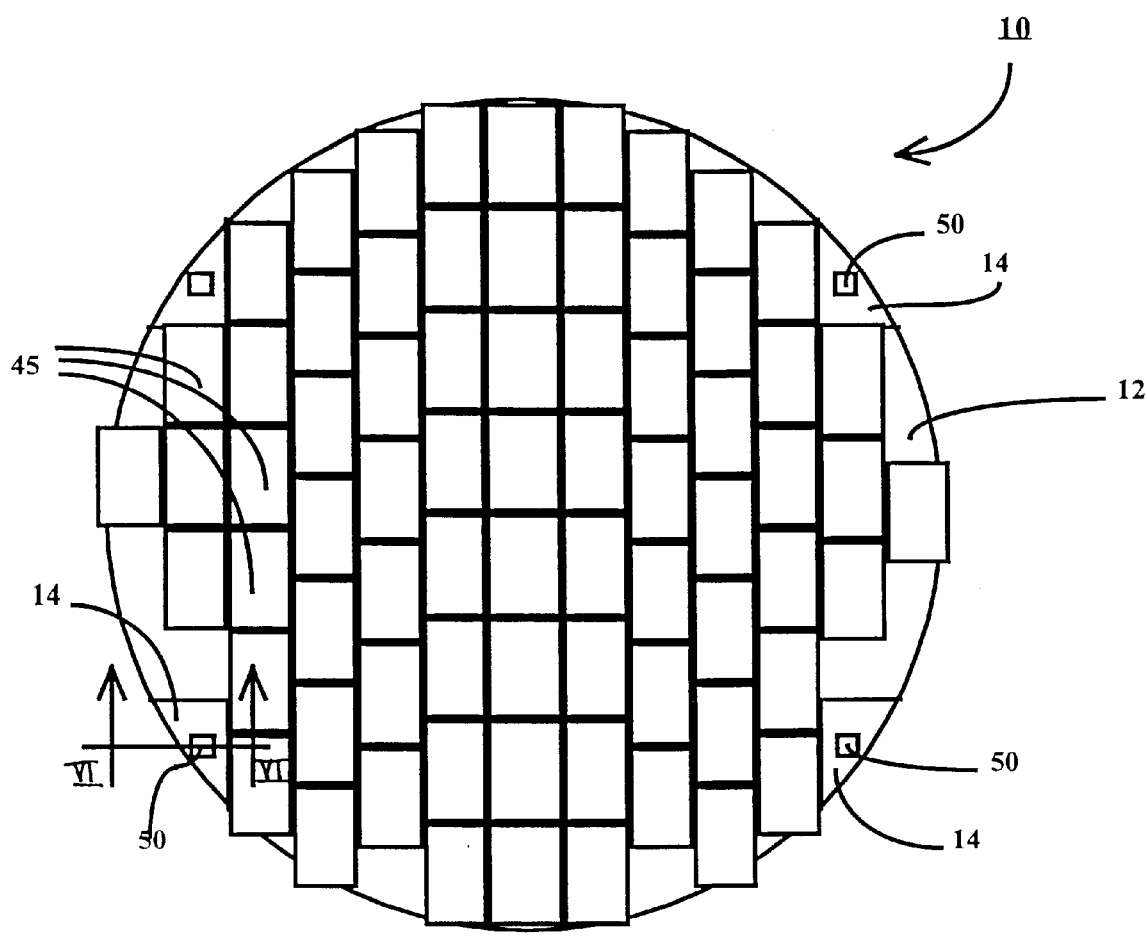
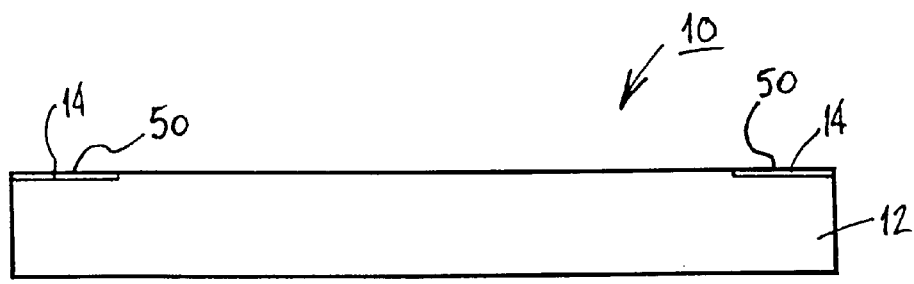
FIG. 2

AUTOMATED COMBI DEPOSITION APPARATUS AND METHOD

FIELD OF THE INVENTION

The present invention relates generally to semiconductor wafer fabrication, and more particularly to the protection of global alignment mark sites during etching and other fabrication processes.

BACKGROUND

Rapid thermal process (RTP) reactors have been utilized for some time in the processing of semiconductor wafers. RTP reactors have a significantly shorter process cycle than conventional reactors. For example, while conventional reactors require forty to ninety minutes for processing wafers, RTP reactors need only two to fifteen minutes.

One attendant problem created through the use of RTP reactors is that a high temperature gradient often is generated across the wafer-in-process which leads to plastic deformation. The deformation that occurs is more highly non-correctable along the periphery of the wafer-in-process where non-patterned areas exist.

Global alignment marks are generally sited in non-patterned areas at or near a wafer's periphery, thus rendering them more susceptible to deformation effects than other non-patterned areas nearer the center of the wafer. A suggested method for reducing the deformation effects in global alignment mark (also known as combi) sites is to pattern the sites to reduce the amount of non-patterned area. U.S. patent application Ser. No. 09/587,297, entitled OVERLAY ERROR REDUCTION BY MINIMIZATION OF UNPATTERNED WAFER AREA, having as a named inventor Ziad R. Hatab, filed on Jun. 5, 2000, describes partial patterning combi sites to diminish non-correctable misalignments. The entire disclosure of the Hatab application is incorporated herein by reference.

Although this technique of partial patterning combi sites diminishes non-correctable misalignments, one difficulty encountered is that partial patterning using a stepper is time consuming and more difficult to accomplish than full-field patterning.

There exists a need for a less time intensive procedure for patterning combi sites while simultaneously protecting the combi sites from damage due to one or more subsequent processing steps.

SUMMARY

The invention provides a semiconductor wafer-in-process which includes a substrate, one or more global alignment sites located on a surface of the substrate, each site including a global alignment mark, a partially developed layer of photoresist material over the global alignment mark, and a globule of protective material deposited over one or more of the global alignment sites which protects the global alignment sites during an etch of a wafer using the patterned photoresist material.

The invention also provides a semiconductor wafer-in-process that includes a substrate, one or more global alignment sites located on a surface of the substrate, each site including a global alignment mark, conductive patterning positioned peripheral to the marks, and a globule of protective material deposited over one or more of the global alignment sites and a portion of the conductive patterning to protect the sites and the conductive patterning during subsequent etching operations.

The invention further provides a system for depositing protective material globules on a wafer-in-process. The system includes a protective material deposition device including a chamber adapted to receive and retain protective material and a nozzle extending from said chamber. The system also includes a base upon which the wafer-in-process is supported.

The invention further provides a method of fabricating a semiconductor wafer having one or more global alignment sites. The method includes coating the wafer with a photoresist material including over the global alignment sites, exposing one or more portions of the photoresist material including over the global alignment sites, developing the exposed portions of the photoresist material, and depositing a protective material globule over one or more global alignment sites to protect them during an etch of the wafer.

The invention also provides a method of protecting conductive patterning during fabrication of a semiconductor wafer-in-process having a substrate, one or more global alignment sites, each having a global alignment mark. The method includes fabricating conductive patterning at a position peripheral to the global alignment mark, patterning a photoresist material layer on the wafer, and depositing a protective material globule over the alignment marks and at least partially over the conductive patterning to protect both during an etch of the wafer using the patterned photoresist material.

These and other advantages and features of the invention will be more readily understood from the following detailed description which is provided in connection with the accompanying drawings.

BRIEF DESCRIPTION OF THE DRAWINGS

FIG. 1 is a view from the top of a wafer-in-process constructed in accordance with an embodiment of the invention.

FIG. 2 is a side view of the wafer-in-process of FIG. 1.

DETAILED DESCRIPTION OF THE PREFERRED EMBODIMENTS

Figure 3:
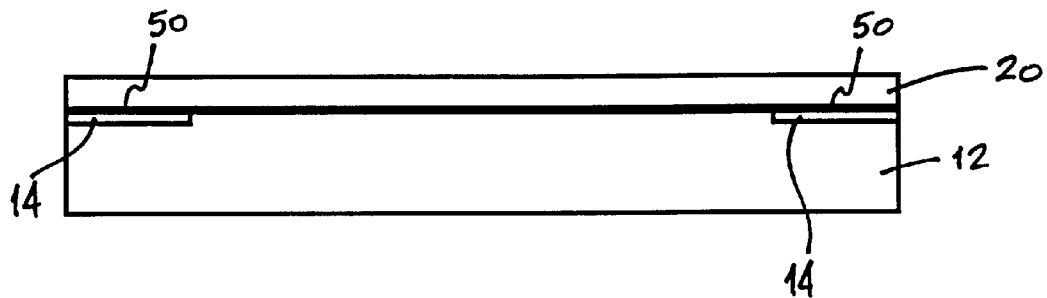
FIG. 3 is a side view of the wafer-in-process of FIG. 1 showing a photoresist layer.

The terms "wafer", "wafer-in-process" and "substrate" as used herein are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer", "wafer-in-process" or "substrate" in the following description, previous process steps may have been utilized to form regions or junctions in or on the base semiconductor structure or foundation. In addition, the semiconductor need not be silicon-based, but could be based on silicon-germanium, germanium, or gallium arsenide.

Referring to FIGS. 1–9, a wafer-in-process 10 is shown in various stages of fabrication. The wafer-in-process 10 may be formed of any materials suitable for semiconductor fabrication. The wafer-in-process 10 includes a substrate 12, which may be formed of silicon or other semiconductor material which may have one or more layers of material on it which have been patterned and fabricated to define device features.

A plurality of global alignment mark sites, also known as combi sites, 14 are shown on substrate 12 roughly evenly separated from one another. The combi sites 14 are located along a periphery of the substrate 12. As shown, four such combi sites 14 are located on the substrate; however, any number of such sites 14 capable of containing combi marks which are used to provide proper fabrication alignment is within the scope of the invention.

As noted above, combi marks, such as the combi mark 50 shown in FIGS. 1, 3–6 and 10, are located within sites 14 in non-patterned (unfabricated) areas of the substrate 12. Device fabrication is typically not performed at a wafer's periphery, and so designers generally locate the combi sites 14, and hence the combi marks 50, there. Non-patterned areas located along the periphery of a wafer-in-process are susceptible to thermally induced, non-correctable plastic deformation. To reduce the plastic deformation experienced at combi sites, patterning used to form device features in other parts of the wafer is also deposited on the combi sites. This process will now be described.

Figure 10:
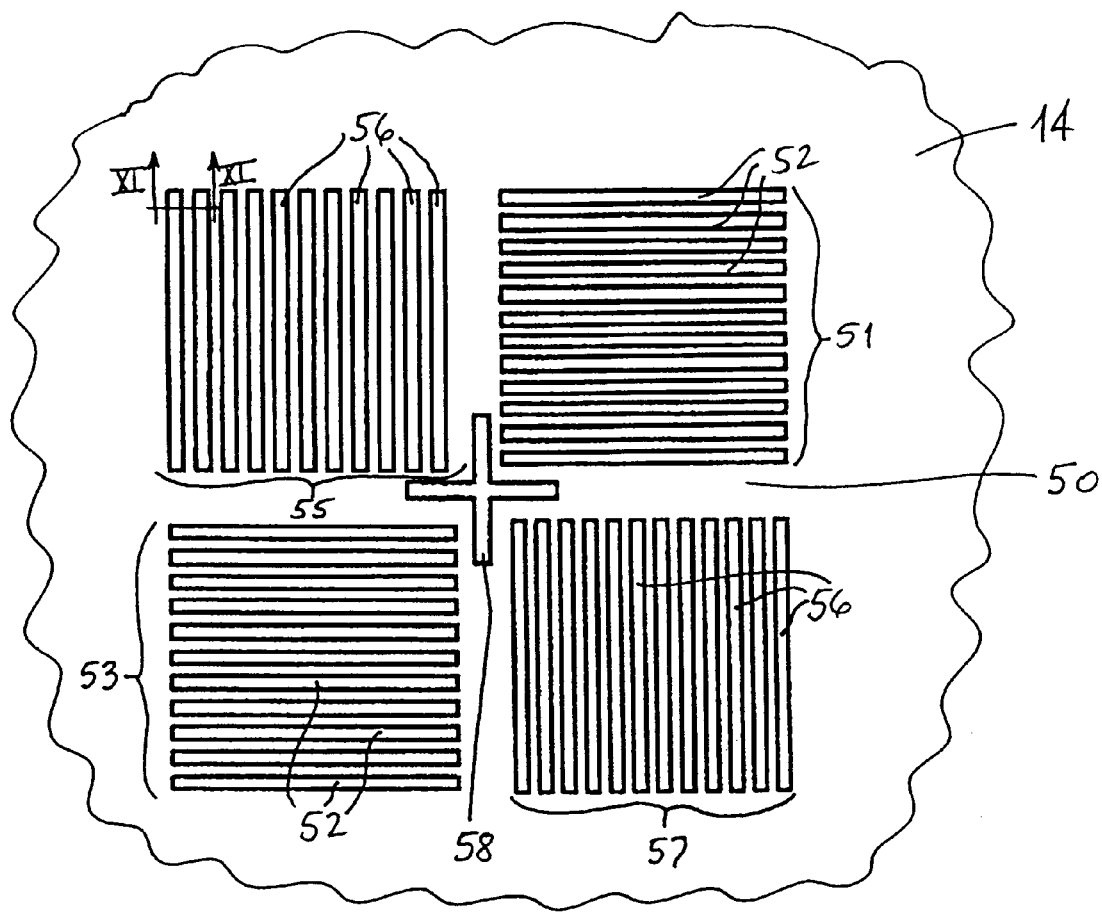
FIG. 10 is a view from the top of a global alignment mark.

A typical combi 50 is shown in FIG. 10 as positioned within the combi site 14 and includes a plurality of parallel grooves 52 bundled into a pair of sets 51, 53, and a second plurality of parallel grooves 56 bundled into a second pair of sets 55, 57. The grooves 56 are generally perpendicular to the grooves 52. The sets 51, 53, 55, 57 are arranged close to one another and roughly in a square shape. Each set is adjacent to sets with grooves going in different directions from it. For example, set 51 is adjacent to sets 55 and 57, which have grooves 56 perpendicular to grooves 52 set 51. Positioned interior to each of the sets 51, 53, 55, 57 is a cross-shaped groove 58.

Figure 4:
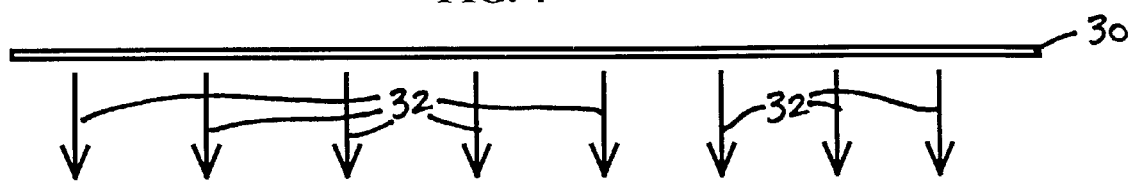
FIG. 4 is a side view illustrating the exposure of the photoresist layer of FIG. 3.
Figure 4:
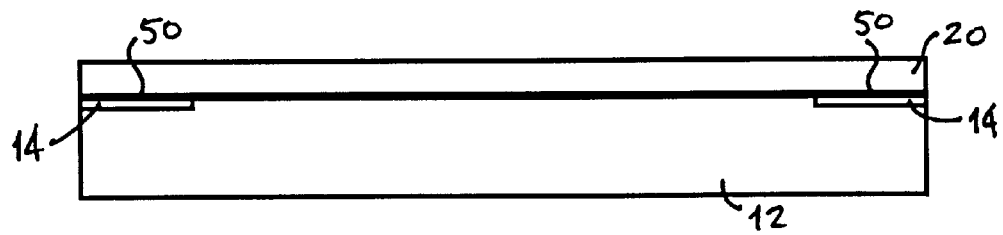
Figure 5:
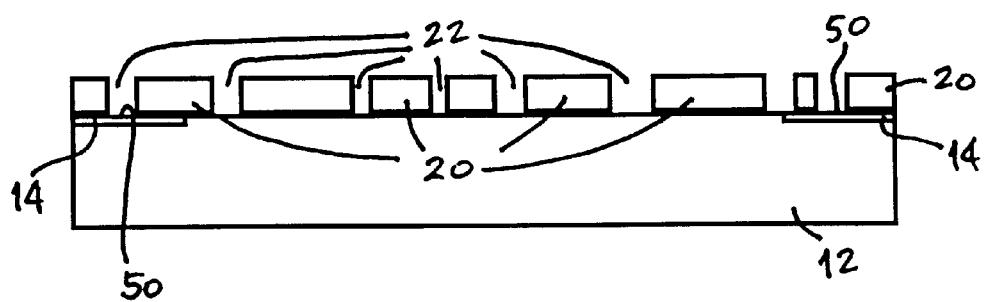
FIG. 5 is a side view of the wafer-in-process of FIG. 3 showing the development of the photoresist layer.

The surface of the substrate 12 will undergo a fabrication step which includes applying a photoresist, developing the photoresist to form a pattern for an etch step and then etching the substrate 12 top surface to form a plurality of features therein. To this end, a layer of photoresist material 20 is provided over the substrate 12, including over the combi sites 14 and the combi marks 50 (FIG. 3). The layer of photoresist material 20 is exposed through a mask 30, such as a reticle (FIG. 4). Specifically, radiant energy 32 extends through the mask 30 and exposes portions of the photoresist material 20 for feature fabrication.

Generally a stepper or other suitable exposure device (not shown) is used to expose the photoresist layer of wafers-in-process, such as the wafer-in-process 10. Conventionally, steppers have performed full field exposures 45 (FIG. 1) of only the portions of a wafer-in-process that will be used to pattern a die. By full field exposure is meant that the steppers expose a full mask field for a full die. After exposing a first full field, the stepper then moves to another site and performs another full field exposure and so on until the locations capable of sustaining a full-field exposure on the wafer-in-process are exposed.

In an embodiment of the invention, a stepper or other suitable exposure device performs a plurality of full field exposures over the entire wafer-in-process 10, including over the combi sites 14 as shown in FIG. 4. Thus, the photoresist material 20 will be exposed through the mask 30 over the combi sites 14 in the same pattern as it is exposed over any other portion of the wafer-in-process 10.

Figure 6:
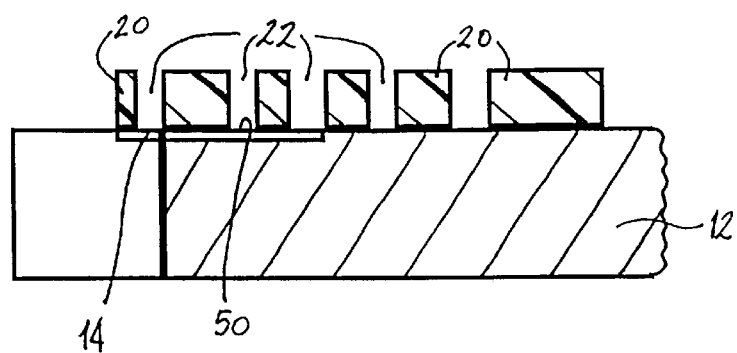
FIG. 6 is a partial cross-sectional view taken along line VI—VI of FIG. 1.

The exposed portions of the photoresist material 20 are developed (FIGS. 5–6) producing a plurality of openings 22. As shown in FIG. 6, some of the photoresist material 20 covers a portion of the combi site 14. A portion of the photoresist material 20 over the combi 50 has been developed in accordance with the field image, leaving an opening 22 in the photoresist material 20 which exposes the combi 50.

Figure 7:
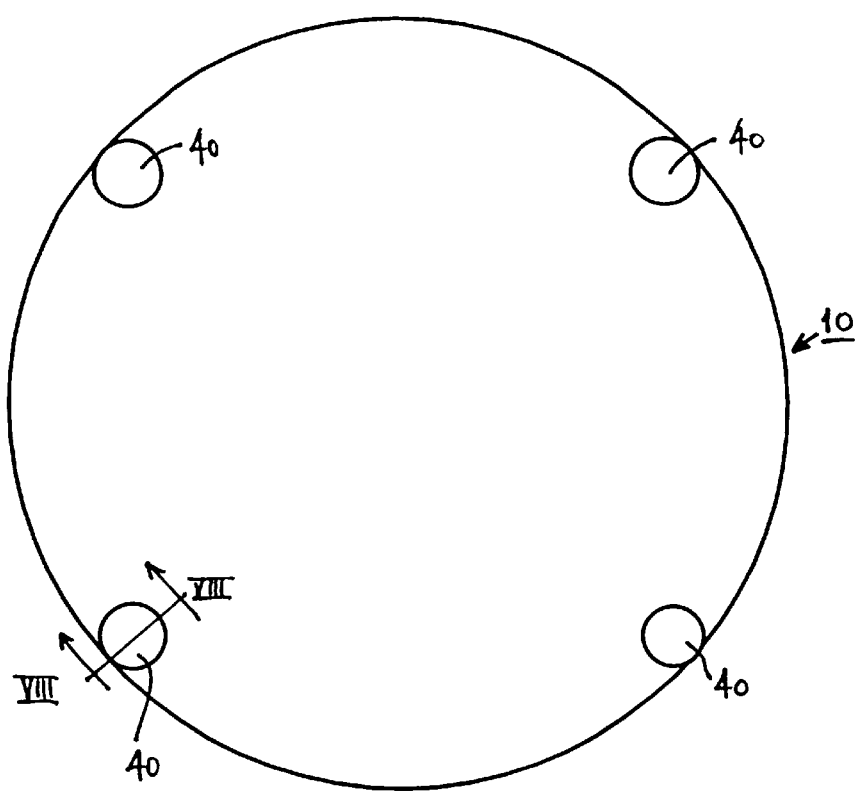
FIG. 7 is a view from the top of the wafer-in-process of FIG. 1 showing photoresist globules.
Figure 8:
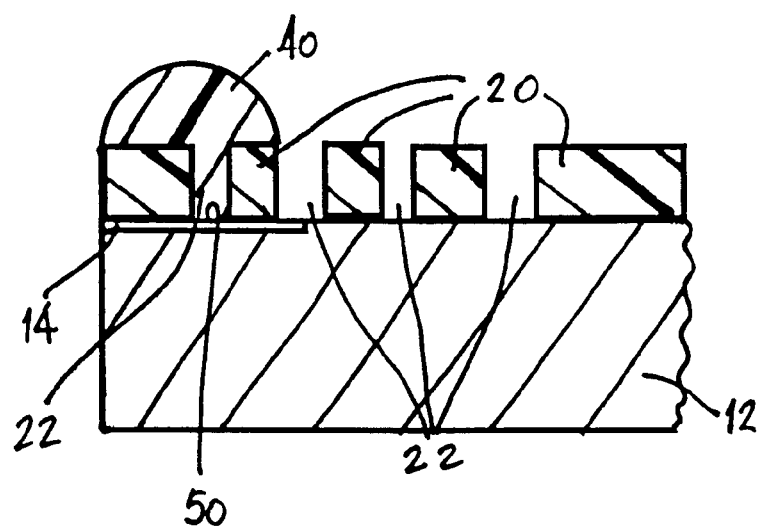
FIG. 8 is a partial cross-sectional view taken along line VIII—VIII of FIG. 7.

The now patterned photoresist material 20 is next typically used to etch features into the substrate 12. However, before etching is performed, and in accordance with the invention, the combi sites 14 are covered with a non-etchable material to provide protection from the etching process. Preferably, a protective material 40 is placed over the combi marks 50 and over the photoresist material 20 covering each combi site 14 (FIGS. 7–8). The protective materials 40 fill in the openings 22 within the photoresist material 20 over the combi marks 50 and protect the combi marks 50 during subsequent etching process.

The protective materials 40 may be formed of any materials suitable for protecting the combi marks 50 from the deleterious effects of etching materials. Examples of suitable protective layers include polymeric materials, either with or without photoactive elements, such as novelac resin or photoresist; bottom anti-reflective coatings; spin-on glass materials; low dielectric constant materials; and, polyimides. It is to be understood that other materials suitable as protective materials are within the scope of the invention.

Figure 9:
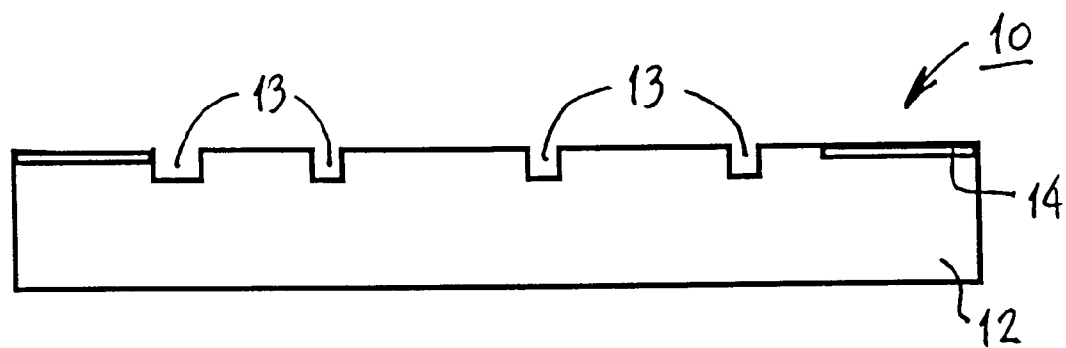
FIG. 9 is a side view of the wafer-in-process of FIG. 1 showing etched portions.

The next step is to etch the wafer-in-process 10. The etching step etches the exposed substrate 12, while being ineffective against the photoresist material 20 and the protective material layers 40, and produces etched features, shown as grooves 13, in the substrate 12 (FIG. 9). After etching, the photoresist material 20 and the protective materials 40 are removed at the same time in a removal step, such as by ashing. Fabrication of the wafer using the now etched surface may now continue.

It is to be understood that the above described method may be performed on a base substrate 12, and on additional, higher layers of material over substrates 12. In this way, the combi marks 50 are protected during the processing of the substrates 12, while the field patterning over the combi sites 14 reduces thermal stress-induced deformations, thus enabling the combi marks 50 to be used to maintain accurate registration between various layers over the substrate 12.

There may be instances where a combi site 14 is immediately adjacent to a die structure, such as conductive patterning, which may become exposed during wafer processing and which needs to be protected during etching. In such instances, it may be necessary to provide a protective material layer over not only the combi marks 50, but also over at least a portion of the conductive patterning to prevent it from being undesirably etched.

Figure 11:
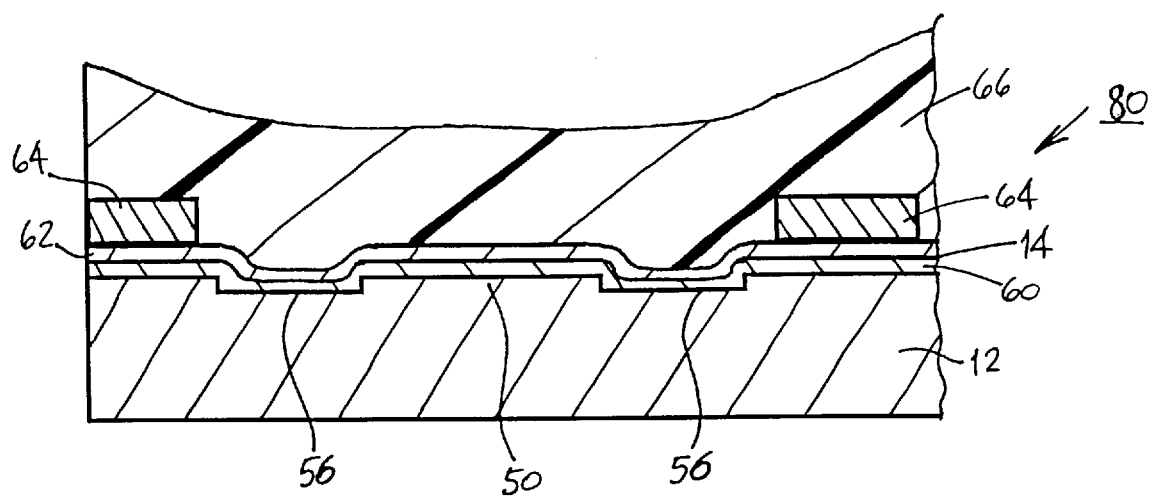
FIG. 11 is a partial cross-sectional view taken along line XI—XI of the global alignment mark of FIG. 10.
Figure 12:
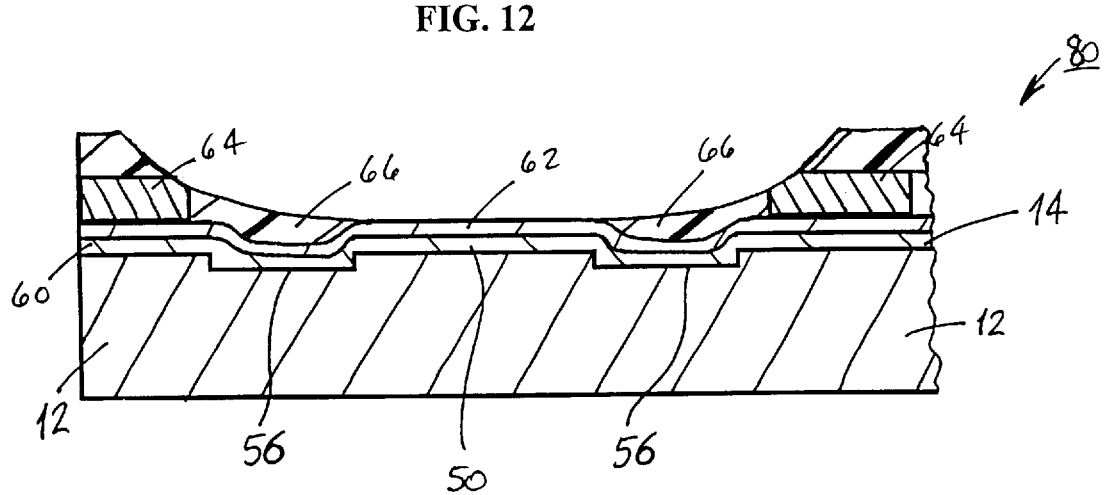
FIG. 12 is another partial cross-sectional view of the global alignment mark of FIG. 11 showing etched metallic patterning.

In the embodiment illustrated in FIG. 11, a pair of thin insulating material layers 60, 62 are provided over the substrate 12 of a wafer-in-process 80. Although two such layers are illustrated, none, one, or more than two layers may be employed. Conductive patterning 64 of an adjacent die area is located on the layer 62. Overlaying the layers 60, 62 and the patterning 64 is an intralayer dielectric (ILD) material 66 which is typically designed to protect the conductive patterning 64. As shown, during processing of the wafer, for example chemical-mechanical polishing (CMP) processing, the ILD material 66 may dip toward the substrate 12 as a function of the grooves 56, which are part of the combi marks 50. In a subsequent etching step, the ILD material 66 may be insufficient to protect the conductive patterning 64 from being etched. This may result in damage to the conductive patterning 64 (FIG. 12), causing cosmetic defects which in turn may lead to inspection problems.

Figure 13:
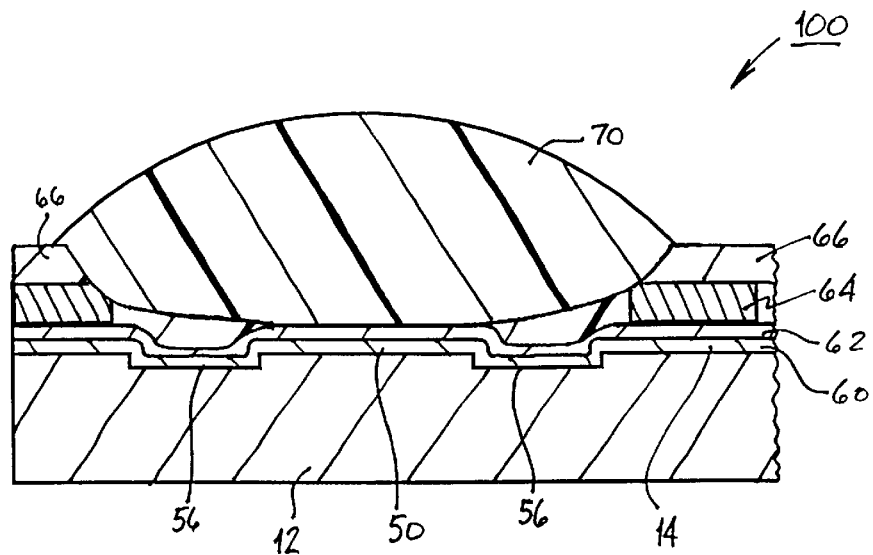
FIG. 13 is a partial cross-sectional view of a global alignment mark covered by a photoresist glob in accordance with an embodiment of the invention.

To protect the conductive patterning 64 in areas adjacent the combi marks 50, the protective material which is used to protect the combi marks 50 can be extended to also cover and protect adjacent conductive patterning 64. This will now be described with reference to FIG. 13.

A wafer-in-process 100 includes the substrate 12, the insulation layers 60, 62, the ILD 66, and the conductive patterning 64. A protective material 70 is positioned over the ILD 66 and the grooves 56 and partially over the metallic patterning 64. The protective material 70 may be formed of the same material as the protective material 40. Thus, in a subsequent wet etching step, such as a CMP cleaning, the protective material 70 protects the metallic patterning 64 from damage. After the wet etching, a remainder of the protective material 70 is present between the metallic patterning and over the ILD 66 covering the grooves 56 of the combi marks 50. A subsequent cleaning, such as ashing, will remove any remaining protective material 70 and the ILD 66.

Figure 14:
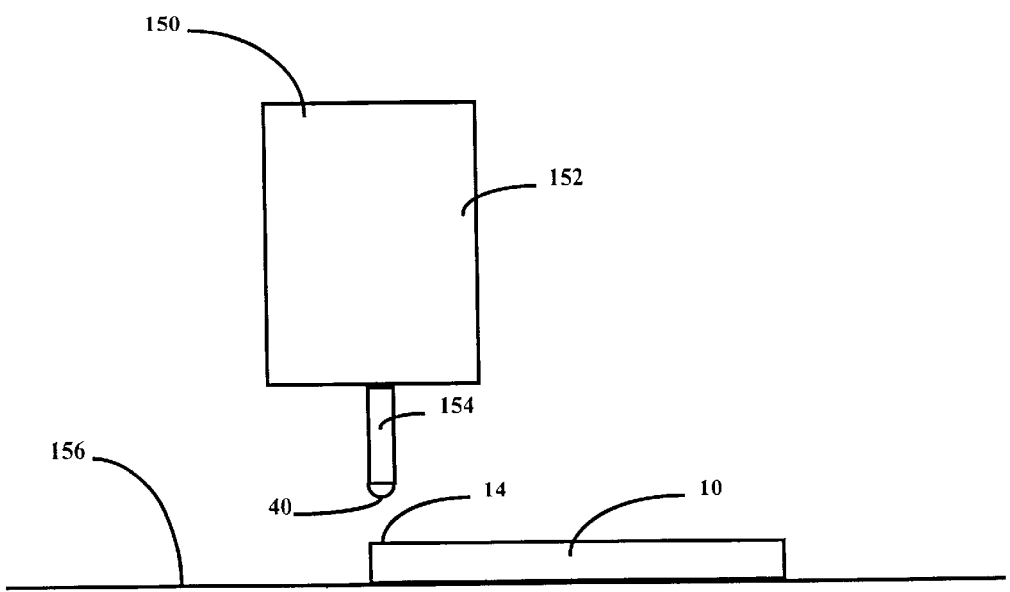
FIG. 14 is a side view of a photoresist globule deposition device constructed in accordance with an embodiment of the invention.
Figure 15:
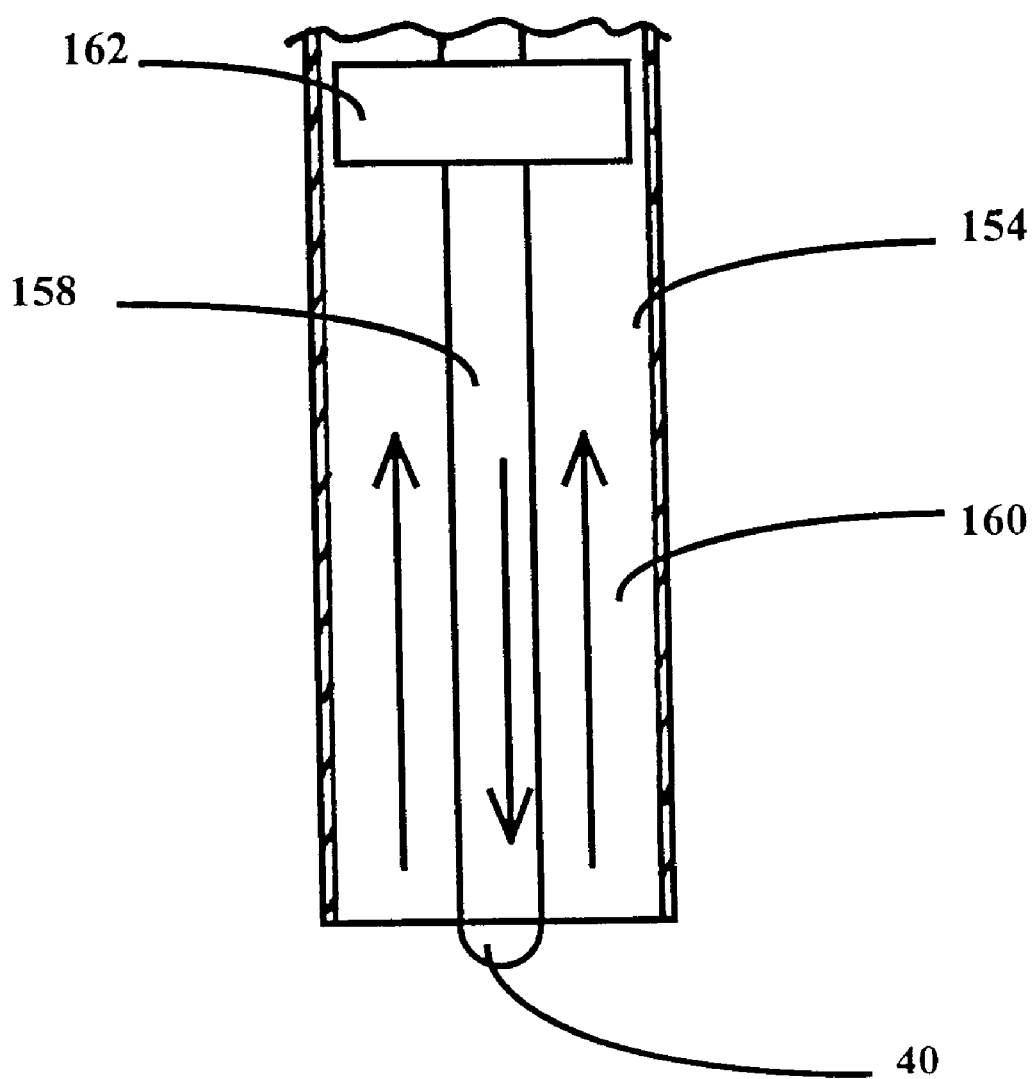
FIG. 15 is a partial cross-sectional view of the nozzle of the deposition device of FIG. 14.

FIGS. 14–15 shows a photoresist deposition device 150 which may be used to deposit protective materials in accordance with the invention. The device 150 includes a chamber 152 in which is stored protective material. Extending from a lower portion of the chamber 152 is a nozzle 154. The nozzle 154 is configured and dimensioned to eject protective materials, such as the protective materials 40, 70, and also vacuum away excess protective material from the protective material deposition sites. The device 150 may be an automated combi etcher which has been redesigned to be selectively usable in a deposition mode. Alternatively, the device 150 may function solely as a deposition device.

The nozzle 154 includes an inner conduit 158 through which material making up the protective material flows from the chamber 152. The tip of the nozzle 154 is configured to produce a globule of the protective material, such as the protective material 40, 70. Nevertheless, it is possible that too much protective material may exit the nozzle 154. External to the conduit 158 is an annulus 160 in fluid connection with the chamber 152. A vacuum device 162 is in connection with the annulus 160 to facilitate reception of any excess protective material.

In operation, a wafer-in-process 10 is positioned on a base 156 such that a combi site 14 is beneath the nozzle 154. Either the device 150, the base 156, or the wafer-in-process 10 can be moved to so position it. A globule of protective material 40 or 70 is then ejected from the nozzle 154 onto the combi site 14. If too much protective material is ejected from the nozzle 154, the vacuum device 162 is put into operation and excess protective material is sucked up the annulus 160 and back into the chamber 152.

Figure 16:
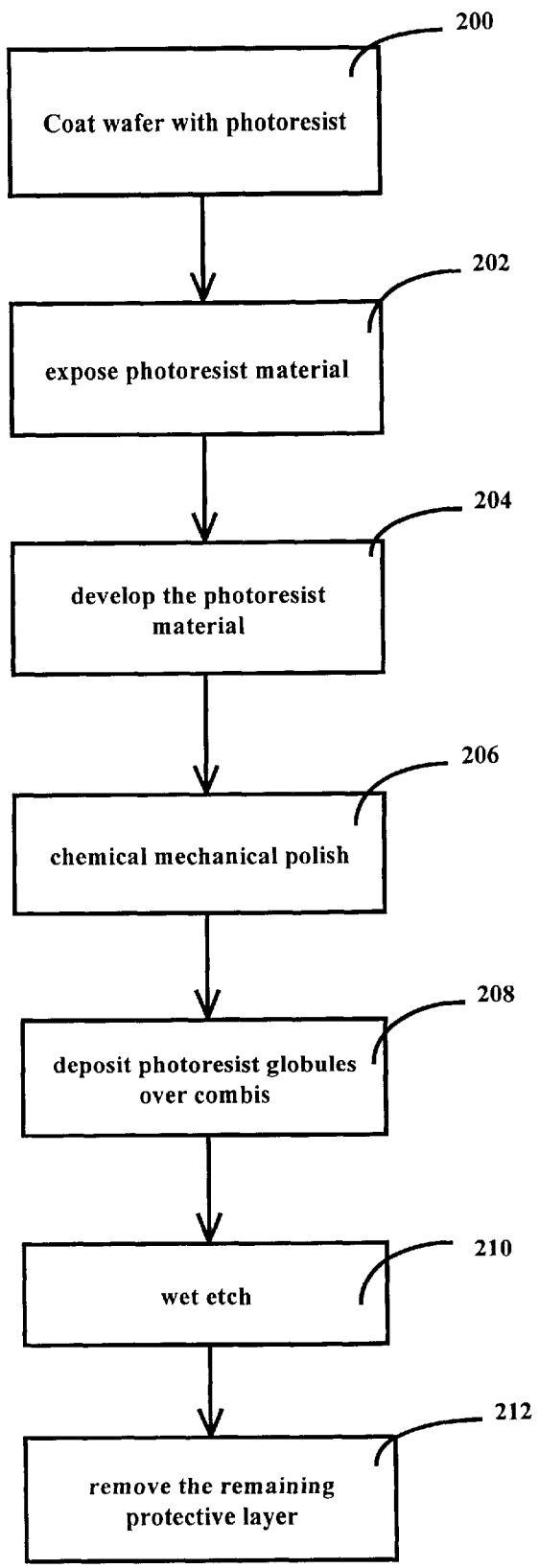
FIG. 16 is a flow diagram of the steps for selectively placing photoresist on global alignment marks in accordance with an embodiment of the invention..

FIG. 16 outlines a method for depositing protective materials on combi sites to protect such sites from damage from other fabrication steps. At step 200, the entire wafer-in-process 10 is coated with a layer of photoresist 20 as part of a wafer fabrication process. Portions of the photoresist 20 are exposed at step 202, and those exposed portions are developed at step 204. The wafer-in process is then polished, such as through a CMP polish, at step 206. Protective materials 40 or 70 are then deposited over combi marks 50 at step 208. The wafer-in-process 10 is then wet etched at step 210. The remaining protective material 40, 70 and ILD 66 is removed by ashing at step 212. The foregoing steps may be applied for each masking layer which requires an etching step.

While the foregoing has described in detail preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of protecting one or more global alignment sites on a wafer from being etched, comprising:
    coating the wafer with a photoresist material including over said global alignment sites;
    exposing one or more portions of the photoresist material;
    developing the exposed portions of the photoresist material including over said global alignment sites; and
    depositing a protective material globule over one or more global alignment sites.

2. The method of claim 1, wherein said patterning of photoresist material comprises patterning the photoresist material over the global alignment sites by using full field images.

3. The method of claim 2, further comprising etching the wafer.

4. A method of protecting one or more feature structures during fabrication of a semiconductor wafer-in-process having a substrate and one or more global alignment sites, each having a global alignment mark, said method comprising:
    forming the feature structures at a position immediately adjacent to the global alignment sites; and
    depositing a protective material over the global alignment mark and at least partially over the feature structures, said protective material protecting the global alignment sites from being etched.

5. The method of claim 4, further comprising pattering a photoresist material over the global alignment sites before depositing said protective material.

6. The method of claim 5, wherein said patterning of photoresist material comprises pattering photoresist material over the global alignment sites by using full field images.

7. The method of claim 4, further comprising positioning or more material layers over the global alignment marks.

8. The method of claim 4, wherein said protective material comprises a protective material globule.

9. The method of claim 8, further comprising removing a portion of the protective material globule.

10. The method of claim 9, wherein said removing step is accomplished through ashing.

11. A method of protecting one or more global alignment sites on a wafer from being etched, comprising:

coating the wafer with a photoresist material including over said global alignment sites;

exposing one or more portions of the photoresist material;

developing the exposed portions of the photoresist material including over said global alignment sites; and depositing an etch resistant material over one or more global alignment sites.

* * * * *

UNITED STATES PATENT AND TRADEMARK OFFICE
CERTIFICATE OF CORRECTION

PATENT NO. : 6,417,076 B1
DATED : July 9, 2002
INVENTOR(S) : Richard D. Holscher, Ziad R. Hatab and David Q. Wright It is certified that error appears in the above-identified patent and that said Letters Patent is hereby corrected as shown below:

Title page,
Item [56], References Cited, OTHER PUBLICATIONS, change "Sress" to -- Stress --;

Column 6,
Line 66, change "pattering" to -- patterning --.

Signed and Sealed this

Twenty-seventh Day of August, 2002

Attest:

Attesting Officer

JAMES E. ROGAN
Director of the United States Patent and Trademark Office